United States Patent
Simao

(10) Patent No.: US 10,187,058 B2
(45) Date of Patent: Jan. 22, 2019

(54) HALL-EFFECT UNIVERSAL CONTROL BUTTON FOR A MAN-MACHINE INTERFACE, AND MAN-MACHINE INTERFACE EQUIPPED WITH SUCH A CONTROL BUTTON

(71) Applicant: ZODIAC AERO ELECTRIC, Montreuil (FR)

(72) Inventor: Antonio Simao, Villeneuve la Garenne (FR)

(73) Assignee: Zodiac Aero Electric, Montreuil (FR)

( * ) Notice: Subject to any disclaimer, the term of this patent is extended or adjusted under 35 U.S.C. 154(b) by 0 days.

(21) Appl. No.: 15/167,657

(22) Filed: May 27, 2016

(65) Prior Publication Data

US 2016/0352333 A1     Dec. 1, 2016

(30) Foreign Application Priority Data

May 27, 2015   (FR) ..................... 15 54733

(51) Int. Cl.

| | |
|---|---|
| *H01H 9/00* | (2006.01) |
| *H03K 17/95* | (2006.01) |
| *G06F 3/02* | (2006.01) |
| *H03K 17/972* | (2006.01) |
| *B64D 43/00* | (2006.01) |
| *G05G 1/02* | (2006.01) |
| *G05G 1/08* | (2006.01) |
| *H01H 11/00* | (2006.01) |

(52) U.S. Cl.
CPC ......... *H03K 17/9517* (2013.01); *B64D 43/00* (2013.01); *G05G 1/02* (2013.01); *G05G 1/08* (2013.01); *G06F 3/0202* (2013.01); *H03K 17/972* (2013.01); *H01H 11/0018* (2013.01); *H03K 2217/94068* (2013.01); *H03K 2217/96042* (2013.01)

(58) Field of Classification Search
CPC ........................................ H03K 17/97
USPC ............................. 335/205; 200/309
See application file for complete search history.

(56) References Cited

U.S. PATENT DOCUMENTS

| | | | | |
|---|---|---|---|---|
| 3,911,429 A | * | 10/1975 | Vinal ............ | G06F 3/0202 336/110 |
| 3,916,131 A | * | 10/1975 | Golbeck ......... | H01H 13/12 200/246 |
| 4,002,873 A | * | 1/1977 | Lewandowski ... | H01H 13/023 200/314 |
| 4,016,388 A | * | 4/1977 | Golbeck ......... | H01H 1/26 200/314 |
| 4,092,503 A | * | 5/1978 | Raeder .......... | H01H 13/12 200/276 |
| 4,209,682 A | * | 6/1980 | Rood ............ | H01H 13/02 200/276 |

(Continued)

FOREIGN PATENT DOCUMENTS

| | | |
|---|---|---|
| EP | 2 781 993 A2 | 9/2014 |
| EP | 2 814 048 A1 | 12/2014 |

*Primary Examiner* — Alexander Talpalatski
(74) *Attorney, Agent, or Firm* — Morgan, Lewis & Bockius LLP

(57) ABSTRACT

A Hall-effect universal control button for a man-machine interface includes a base adapted for mounting on the interface, and a plurality of manually actuable and interchangeable control modules. Each control module is mountable on the base and includes a bipolar magnet. The base includes at least one sensor to detect a magnetic field of the magnet.

11 Claims, 1 Drawing Sheet

(56) References Cited

U.S. PATENT DOCUMENTS

| | | | | |
|---|---|---|---|---|
| 4,354,077 A | * | 10/1982 | McMains | H01H 13/83 200/292 |
| 4,434,338 A | * | 2/1984 | Rood | H01H 1/242 200/241 |
| 5,570,114 A | * | 10/1996 | Fowler | H01H 13/702 116/DIG. 35 |
| 6,140,593 A | * | 10/2000 | Bramesfeld | H01H 13/70 200/341 |
| 6,566,619 B2 | * | 5/2003 | Gillman | H01H 23/30 200/339 |
| 6,587,056 B1 | * | 7/2003 | Fraser | H03K 17/97 200/11 R |
| 6,747,226 B2 | * | 6/2004 | Watanabe | H01H 13/023 200/314 |
| 6,841,895 B1 | * | 1/2005 | Kelwaski | H01H 23/30 200/1 R |
| 9,411,370 B2 | * | 8/2016 | Benni | G06F 1/1632 |
| 2007/0182514 A1 | * | 8/2007 | Brandl | B62K 23/04 335/37 |
| 2008/0238650 A1 | | 10/2008 | Riihimaki et al. | |
| 2009/0195406 A1 | * | 8/2009 | Brown | H01H 13/70 340/4.37 |
| 2011/0181446 A1 | * | 7/2011 | O'Donnell | H01H 13/76 341/22 |
| 2014/0289438 A1 | * | 9/2014 | Benni | G06F 1/1632 710/303 |
| 2014/0372124 A1 | * | 12/2014 | Thizon | G10L 15/28 704/270 |
| 2016/0064172 A1 | * | 3/2016 | Kirbawy | H01H 36/004 335/180 |

* cited by examiner

HALL-EFFECT UNIVERSAL CONTROL BUTTON FOR A MAN-MACHINE INTERFACE, AND MAN-MACHINE INTERFACE EQUIPPED WITH SUCH A CONTROL BUTTON

CROSS-REFERENCE TO RELATED APPLICATION

This application claims priority under 35 U.S.C. 119(a) to French Patent Application No. 1554733 filed on May 27, 2015, which is incorporated herein by reference in its entirety for all purposes.

TECHNICAL FIELD

This disclosure relates generally to man-machine interfaces for aircrafts, more specifically to a Hall-effect control button for a digital panel man-machine interface in an aircraft cockpit.

BACKGROUND

Aircraft cockpit control panels are generally equipped with a number of control buttons, which may be manually actuated by pilots for the execution of one or more avionic functions. These control buttons are generally electro-mechanical control buttons, for example push-buttons incorporating switches, rotary potentiometer buttons or any other control device operating by the rotation of a button (rotary switches, encoders, etc.).

It is generally understood that the number of control buttons and the dimensions thereof impose constraints which must be taken into account by manufacturers of control panels.

Generally, control buttons assume a power switching function, and consequently become part of the power supply circuit of the components which they control.

Depending upon the type of components controlled, a control panel may be equipped with rotary buttons, which may assume a number of predetermined angular selection positions or may be of the continuous rotation type, or push-buttons. It is therefore necessary to include provisions for various types of rotary buttons or push-buttons, which must be permanently mounted on the control panel in the requisite configuration. Accordingly, it is not generally possible to replace one type of button, for example a push-button, with another type of button, for example a rotary button, in order to adapt, for example, to a specification which dictates a specific configuration for the control panel.

The above information disclosed in this Background section is only for enhancement of understanding of the background and therefore it may contain information that does not form art that is already known in this country to a person of ordinary skill in the art.

SUMMARY

In consideration of the above constraints, various embodiments of this disclosure are directed to providing a universal control button for a man-machine interface, which is suitable for interchangeable mounting on such an interface. Additionally, various embodiments are directed to providing such a universal control button which delivers improved reliability, with reduced spatial requirements.

In accordance with some embodiments, a Hall-effect universal control button for a man-machine interface includes a base adapted for mounting on the interface, and a plurality of manually actuable and interchangeable control modules. Each control module is mountable on the base and includes a bipolar magnet. The base includes at least one sensor to detect a magnetic field of the magnet.

Accordingly, by the use of interchangeable control modules which can be mounted on a universal base, it is possible to configure a control panel from generic components which are selectively fitted to the interface. Moreover, the use of a Hall-effect control button permits a significant improvement of reliability.

In some embodiments, the at least one sensor is configured to detect at least one of a rotational motion and a translational motion of the magnet.

In some embodiments, each control module includes lighting and a lighting board for control of the lighting based on lighting signals originating from the interface.

In other words, the button also executes a signaling function, which specifically permits the simple identification of the position of the button or the delivery of additional information to the pilot.

In some embodiments, each control module includes at least one lug, configured to engage with a socket provided in the base for mechanical coupling and electrical connection of each control module to the base. The lug and the socket each include contacts. The contacts of the lug are configured to contact the contacts of the socket for transmission of lighting and power supply signals.

In some embodiments, the plurality of control modules includes a continuous-rotation rotary control module.

In some embodiments, the plurality of control modules includes a rotary control module with a module position encoding function.

In some embodiments, the rotary control module is actuated by a pull-push function.

In some embodiments, the plurality of control modules includes a push-button control module.

In some embodiments, the base and the control modules include numerous and separate detection and control circuits.

In some embodiments, the detection and control circuits are linked by a communication bus.

In accordance with some embodiments, a man-machine interface includes a plurality of control buttons. Each control button includes a base adapted for mounting on the interface, and a plurality of manually actuable and interchangeable control modules. Each control module is mountable on the base and includes a bipolar magnet. The base includes at least one sensor to detect a magnetic field of the magnet.

The methods and apparatuses of the various embodiments have other features and advantages which will be apparent from or are set forth in more detail in the accompanying drawings, which are incorporated herein, and the following Detailed Description, which together serve to explain certain principles of the various embodiments of this disclosure.

BRIEF DESCRIPTION OF THE DRAWINGS

For a better understanding of the various described embodiments, reference should be made to the Detailed Description below, in conjunction with the following drawings. Like reference numerals refer to corresponding parts throughout the figures and description.

It should be understood that the appended drawings are not necessarily to scale, presenting a somewhat simplified representation of various features illustrative of the basic principles of the various embodiments of this disclosure. The specific design features of the various embodiments as disclosed herein, including, for example, specific dimensions, orientations, locations, and shapes will be determined in part by the particular intended application and use environment.

DETAILED DESCRIPTION

Reference will now be made to embodiments, examples of which are illustrated in the accompanying drawings. In the following description, numerous specific details are set forth in order to provide an understanding of the various described embodiments. However, it will be apparent to one of ordinary skill in the art that the various described embodiments may be practiced without these specific details. In other instances, well-known systems, methods, procedures, components, circuits, and networks have not been described in detail so as not to unnecessarily obscure aspects of the embodiments.

It will also be understood that, although the terms first, second, etc. are, in some instances, used herein to describe various elements, these elements should not be limited by these terms. These terms are used only to distinguish one element from another. For example, a first pair could be termed a second pair, and, similarly, a second pair could be termed a first pair, without departing from the scope of the various described embodiments. The first pair and the second pair are both pairs, but they are not the same pair.

Figure 1:
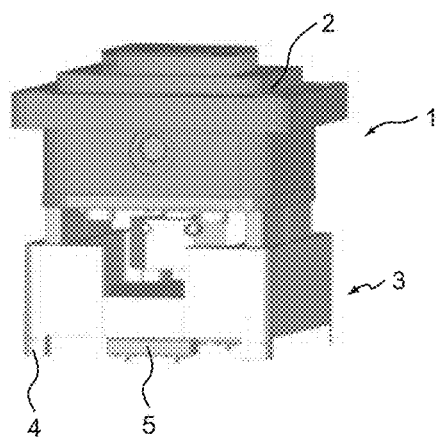
FIG. 1 illustrates a side perspective view of a control button in accordance with some embodiments.
Figure 2:
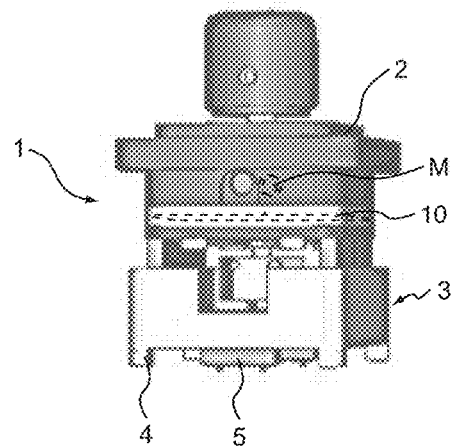
FIG. 2 illustrates a configuration of the control button represented in FIG. 1 in accordance with some embodiments.
Figure 3:
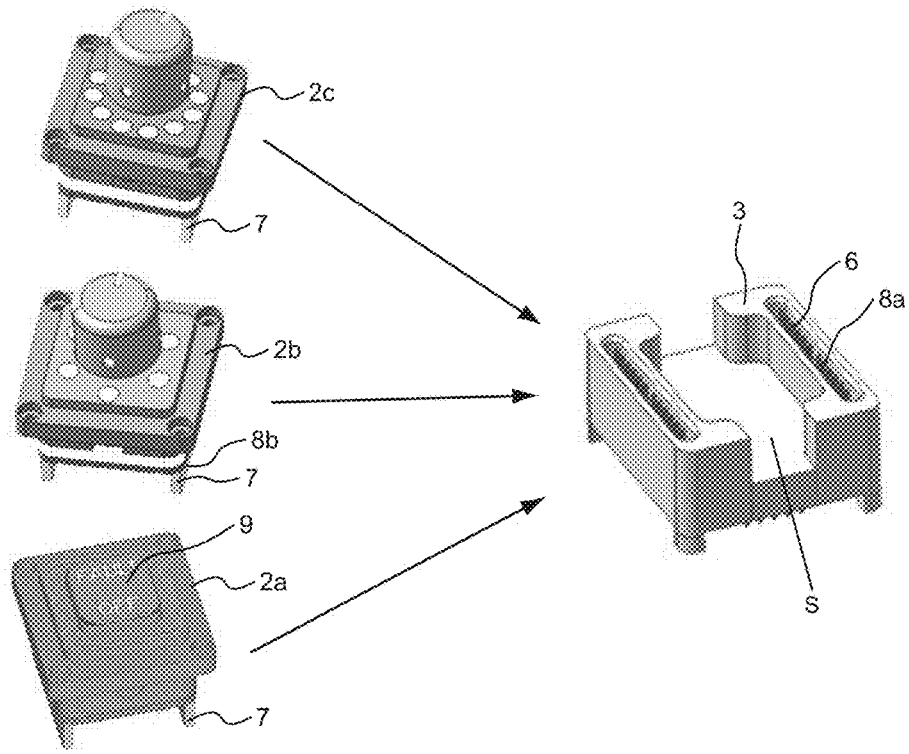
FIG. 3 illustrates an assembly of the control button in accordance with some embodiments.

The terminology used in the description of the various embodiments described herein is for the purpose of describing particular embodiments only and is not intended to be limiting. As used in the description of the various described embodiments and the appended claims, the singular forms "a," "an," and "the" are intended to include the plural forms as well, unless the context clearly indicates otherwise. It will also be understood that the term "and/or" as used herein refers to and encompasses any and all possible combinations of one or more of the associated listed items. It will be further understood that the terms "includes," "including," "comprises," and/or "comprising," when used in this specification, specify the presence of stated features, integers, steps, operations, elements, and/or components, but do not preclude the presence or addition of one or more other features, integers, steps, operations, elements, components, and/or groups thereof FIGS. 1 to 3 represent a control button 1 in accordance with some embodiments. The control button 1 is designed for mounting in a digital panel of a man-machine interface in an aircraft cockpit, and for manual actuation by a pilot for the execution of one or more avionic functions. As indicated above, the control button 1 is a Hall-effect universal control button, which includes a control module 2 and a universal base 3. The base 3 is designed for mounting on a digital control panel of the aircraft cockpit and, to this end, is provided with a series of lugs 4, and pins 5 which are designed to engage with corresponding pins provided on the panel for transmitting, to the digital panel, control signals generated during the actuation of the control module 2, and for transmitting to the latter, power supply signals or control signals for the control module 2.

As will be seen from FIG. 3, the universal base 3 includes a body provided with a series of sockets 6, in the case of FIG. 3, two sockets 6, in the form of slots into which lugs 7, having a shape corresponding to the sockets 6 and provided on the control module, are inserted.

As will be seen, the sockets 6 are provided with a number of contacts 8a which are designed to communicate with corresponding contacts 8b on the lugs 7, for the transmission of control signals generated by the control module, to the digital panel, and for the transmission of power supply and control signals from the control module.

As illustrated in FIG. 3, the control button 1 is assembled from a number of interchangeable control modules 2a, 2b, and 2c, which are designed for selective mounting on the universal base 3 capable of accommodating different types of actuators. The control module 2a, 2b or 2c used is selected according to the type of function to be controlled and the nature of corresponding control commands. The control module 2 may be a control button of the push-button type 2a, or a positional rotary encoder button 2b, 2c with a number of predetermined positions. The positional rotary encoder button may be, for example, a rotary button 2b with 6-position encoding, or a rotary button 2c with 12-position encoding. However, the number of predetermined positions positional rotary encoder button is not limited to the aforementioned configurations, but instead, a configuration of the rotary button with 32-position encoding is also possible.

In some embodiments, the rotary button may also be a continuous-rotation push-button.

In some embodiments relating to the rotary buttons 2b, an additional pull-push actuation mode will advantageously be provided, in order to permit the replacement of a push-button, where applicable.

The control modules 2a, 2b and 2c are each designed for plug-in installation on the universal base 3 to form a Hall-effect control button. To this end, the control modules 2 incorporate a bipolar magnet M, a position of which is controlled during the actuation of the button 1, whereas the base 3 incorporates at least one sensor S for the detection of the magnetic field emitted by the bipolar magnet M. In this case, the sensors S are Hall-effect sensors, which measure the magnetic field emitted by the bipolar magnet M which is integrated in the control module 2.

The Hall-effect sensor S is designed to detect both a translational movement and a rotational movement of the bipolar magnet M, and is thus capable of detecting a modification in the magnetic field, both during the rotation of a rotary button control module and during the translation of a control module with a push-button or a rotary button incorporating a pull-push control function.

The control modules also include lighting 9 to provide information to the pilot on the status of the function controlled, or to indicate the zone to be actuated. The lighting 9 may be, for example, an illuminated border surrounding the zone to be actuated, or one or more light spots indicating the position of the control module. The lighting 9 may also be provided in the form of an illuminated ring or an indicator light on push-buttons. In these embodiments, a multi-colored display is advantageously employed. This lighting function is delivered by multi-colored (RGB) electroluminescent diodes, which have the advantage of producing a large spectrum of colors by the additive synthesis of the red, green and blue components. Each control module is thus provided with a lighting board 10, which is identical for all buttons, controlled by the universal base 3 in response to actuation commands for the lighting 9 originating from the digital panel.

In order to improve the reliability of the control buttons, it is advantageously provided that the detection circuits, specifically the Hall-effect sensors S integrated in the base 3, and the control circuits responsible for the control of the control modules 2, are numerous and separate. To this end, the base 3 may include two Hall-effect sensors, two separate communication buses with the control modules, specifically integrated into the sockets 6, two lighting boards 10 to provide the lighting 9, two power supply circuits and two microcontrollers for the control of the control modules 2.

In some embodiments, a synchronization bus is advantageously provided between the numerous and separate detection and control circuits, in order to maintain full performance of the control button, even in the event of a malfunction in one of the detection and control circuits, for example in one of the communication buses.

The various embodiments described above, which employ a universal base and a series of control modules, may be used to provide all the control buttons which are conventionally mounted on an aircraft cockpit panel, by use of a universal base, which is capable of the generic detection of the actuation of any type of control module, thus ensuring the communication of rotational, pushing or pulling actions to the controller of the control panel.

Unlike cockpit components which are conventionally used, the control button described above assumes no power switching function for the control current, but detects the position of the control module, which is then transmitted to the controller of the control panel. In other words, the control button is designed to specifically transmit information which represents the position of the control module, and to receive control and power supply signals, where the power switching function is carried out by the controller of the control panel. Moreover, the control function involves no mechanical components, as the detection of the position of the control module is effected by through the Hall-effect sensor S which is integrated in the base.

A control button according to the various embodiments permits the execution of control with increased accuracy, in that the control signals generated by the control button are digital signals rather than analog signals, and with reduced spatial requirements. The control button of the various embodiments shows improved reliability, achieved by the elimination of the mobility of electronic components. Additionally, the control button of the various embodiments, which is controlled through digital signals and which delivers digital control signals, may be perfectly integrated in a digital control panel of an aircraft cockpit, with improved reliability and reduced spatial requirements.

Finally, in the various embodiments described, a reduction in the height of the control button is achieved, thus permitting a consequent reduction in the thickness of the control panel on which the control button is to be mounted. In this regard, a reduction in height of 30%, or more, is achieved.

The foregoing description, for purpose of explanation, has been described with reference to specific embodiments. However, the illustrative discussions above are not intended to be exhaustive or to limit the scope of the claims to the precise forms disclosed. Many modifications and variations are possible in view of the above teachings. The embodiments were chosen in order to best explain the principles underlying the claims and their practical applications, to thereby enable others skilled in the art to best use the embodiments with various modifications as are suited to the particular uses contemplated.

What is claimed is:

1. A Hall-effect universal control button for a man-machine interface, the button comprising:
   a base, adapted for mounting on the interface, comprising a plurality of slot-shaped sockets; and
   a plurality of manually actuable and interchangeable control modules, each control module mountable on the base and comprising a bipolar magnet, wherein:
   the base includes at least one two Hall-effect sensors to detect a magnetic field of the magnet and two separate control circuits for controlling the control modules; and
   each control module comprises:
      a plurality of lugs, each lug being configured to engage with one of the plurality of slot-shaped sockets included in the base for mechanical coupling and electrical connection of each control module to the base, wherein the plurality of lugs and the plurality of slot-shaped sockets each includes contacts, and the contacts of each lug are configured to contact the contacts of one of the plurality of slot-shaped sockets for transmission of lighting and power supply signals; and
      (i) lighting, and (ii) a lighting board for control of the lighting based on lighting signals originating from the interface, wherein each lighting board is identical and each lighting board is controlled by the base.

2. The Hall-effect universal control button according to claim 1, wherein the at least two Hall-effect sensors are configured to detect at least one of a rotational motion and a translational motion of the magnet.

3. The Hall-effect universal control button according to claim 1, wherein the plurality of control modules comprises a continuous-rotation rotary control module.

4. The Hall-effect universal control button according to claim 1, wherein the plurality of control modules comprises a rotary control module with a module position encoding function.

5. The Hall-effect universal control button according to claim 4, wherein the rotary control module is actuated by a pull-push function.

6. The Hall-effect universal control button according to claim 1, wherein the plurality of control modules comprises a push-button control module.

7. The Hall-effect universal control button according to claim 1, wherein the base and the control modules include numerous and separate detection circuits.

8. The Hall-effect universal control button according to claim 7, wherein the detection and control circuits are linked by a communication bus.

9. A man-machine interface comprising a plurality of control buttons, each control button comprising:
   a base, adapted for mounting on the interface, comprising a plurality of slot-shaped sockets; and
   a plurality of manually actuable and interchangeable control modules, each control module mountable on the base and comprising a bipolar magnet, wherein:
   the base includes at least one two Hall-effect sensors to detect a magnetic field of the magnet and two separate control circuits for controlling the control modules; and
   each control module comprises:

a plurality of lugs, each lug being configured to engage with one of the plurality slot-shaped sockets included in the base for mechanical coupling and electrical connection of each control module to the base, wherein the plurality of lugs and the plurality of slot-shaped sockets each includes contact, and the contacts of each lug are configured to contact the contact of one of the plurality of slot-shaped sockets for transmission of lighting and power supply signals; and (i) lighting, and (ii) a lighting board for control of the lighting based on lighting signals originating from the interface, wherein each lighting board is identical and each lighting board is controlled by the base.

10. The Hall-effect universal control button according to claim 1, wherein:

the base is further adapted for electrically connecting to the interface; and the base comprises a plurality of pins to engage with corresponding connectors provided on the interface.

11. The Hall-effect universal control button according to claim 10, wherein:

the base includes opposing first and second surfaces;

each of the plurality of slot-shaped sockets is defined by the first surface; and each of the plurality of pins is provided on the second surface.

* * * * *